United States Patent [19]

Nakagawa

[11] Patent Number: 5,700,389
[45] Date of Patent: Dec. 23, 1997

[54] ETCHING SOLUTION FOR COPPER OR COPPER ALLOY

[75] Inventor: Toshiko Nakagawa, Amagasaki, Japan

[73] Assignee: MEC Co., Ltd., Amagasaki, Japan

[21] Appl. No.: 510,299

[22] Filed: Aug. 2, 1995

[30] Foreign Application Priority Data

Aug. 12, 1994 [JP] Japan .................................. 6-210732

[51] Int. Cl.$^6$ .................................. C23F 3/00; C23F 1/00
[52] U.S. Cl. .................. 252/79.2; 216/105; 252/79.4
[58] Field of Search .................. 252/79.1, 79.2, 252/79.4; 216/105

[56] References Cited

U.S. PATENT DOCUMENTS

| | | | |
|---|---|---|---|
| 4,130,454 | 12/1978 | Dutkewych et al. | 156/659.1 |
| 4,374,744 | 2/1983 | Kawanabe et al. | 252/79.4 |
| 4,849,124 | 7/1989 | Backus | 252/79.4 |
| 5,066,366 | 11/1991 | Lin | 204/12 |
| 5,391,395 | 2/1995 | Duchene | 427/129 |

FOREIGN PATENT DOCUMENTS

| | | |
|---|---|---|
| 0 387 057 | 9/1990 | European Pat. Off. . |
| 2 134 333 | 12/1972 | France . |
| 2 248 329 | 5/1975 | France . |
| 2 251 631 | 6/1975 | France . |
| 2388898 | 11/1978 | France . |
| 52-042727 | 4/1977 | Japan . |
| 1320589 | 6/1973 | United Kingdom . |

OTHER PUBLICATIONS

"Pyridine derivatives as corrosion inhibitors for copper"; Patel et al.; J. Electrochemical Sci. India; c1975; abstract only; 24(2).

Database WPI, Derwent Publications, AN 72-55037T, JP-A-47 033 185, 1972.

*Primary Examiner*—R. Bruce Breneman
*Assistant Examiner*—George Goudreau
*Attorney, Agent, or Firm*—Oblon, Spivak, McClelland, Maier & Neustadt, P.C.

[57] ABSTRACT

An etching solution for copper or copper alloys comprising, (a) sulfuric acid, (b) a persulfate, (c) at least one compound selected from imidazole, imidazole derivatives, pyridine derivatives, triazine, and triazine derivatives, and (d) water. The etching solution exhibits a high etching speed and does not oxidize the copper surfaces after etching.

13 Claims, No Drawings

ETCHING SOLUTION FOR COPPER OR COPPER ALLOY

BACKGROUND OF THE INVENTION

1. Field of the Invention

The present invention relates to an etching solution for copper or copper alloys which is useful for preventing rusting of the copper or copper alloy surfaces and for roughening these surfaces.

2. Description of the Background Art

In the manufacture of printed-wiring boards, copper surfaces are roughened in order to improve adhesion of resins such as etching resists or solder resists to be coated on the copper surfaces. Mechanical cleaning using a buffing or scrubbing machine or chemical cleaning, called microetching, are used for roughening copper surfaces. Chemical cleaning is more popular for treating substrates with fine line patterns.

Conventionally, persulfate-type etching solutions which comprise sulfuric acid and a persulfate have been used for chemical cleaning. These etching solutions have drawbacks such as a slow etching speed and a tendency for polished surfaces to be easily oxidized. Because of this, sulfuric acid-hydrogen peroxide type etching solutions which are free from these problems are being accepted in spite of the high cost.

However, the demand for persulfate-type etching solutions is not insignificant because of the low cost. There is a strong demand to solve of the above-mentioned problems associated with persulfate-type etching solutions.

SUMMARY OF THE INVENTION

The present inventors have conducted extensive studies in order to develop a low cost persulfate-type etching solution, and have found that an etching solution which exhibits a high etching speed and does not oxidize polished surfaces can be prepared by adding imidazole, an imidazole derivative, a pyridine derivative, triazine, or a triazine derivative.

Accordingly, an object of the present invention is to provide an etching solution for copper or copper alloys comprising, (a) an inorganic acid, (b) a persulfate, (c) at least one compound selected from imidazole, imidazole derivatives, pyridine derivatives, triazine, and triazine derivatives, and (d) water.

In a preferred embodiment of the present invention, said etching solution further comprises (e) amidosulfuric acid or an aliphatic sulfonic acid.

Other objects, features and advantages of the invention will hereinafter become more readily apparent from the following description.

DETAILED DESCRIPTION OF THE INVENTION AND PREFERRED EMBODIMENTS

An inorganic acid is added to the persulfate-type etching solution for the purposes of stabilizing the etching speed and ensuring homogeneous etching without uneveness. Specific examples of the inorganic acid include sulfuric acid, hydrochloric acid, and the like. Sulfuric acid is preferred in view of the easiness in handling.

As examples of the persulfate used in the present invention as component (b), ammonium persulfate, potassium persulfate, sodium persulfate, barium persulfate, lithium persulfate, and the like can be given. The concentration of the persulfate can be selected from the range of 50 g/l to the saturated concentration of persulfate in the aqueous solution, and preferably from the range of 50–250 g/l. If this concentration is smaller than 50 g/l, sufficient etching capability cannot be exhibited, resulting in etched products with copper hydroxide remaining on the surface.

Component (c) for the etching solution of the present invention, which is a compound selected from imidazole, imidazole derivatives, pyridine derivatives, triazine, and triazine derivatives, is added to the etching solution for increasing the etching speed and preventing rust on the etched surfaces. Given as examples of the imidazole derivatives are 2-methylimidazole, 2-ethylimidazole, 2-propylimidazole, 2-aminoimidazole, 4-methylimidazole, 4-ethylimidazole, 4-propylimidazole, and the like. Examples of the pyridine derivatives include 2-methylpyridine, 2-aminopyridine, 2-aminomethylpyridine, 2-carboxypyridine, 4-methylpyridine, 4-aminopyridine, 4-aminomethylpyridine, and the like. 2,4-diamino-6-methyltriazine, 2,4-diamino-6-ethyltriazine, and the like are given as examples of the triazine derivatives. The concentration of component (c) in the etching solution is preferably 0.1–10 g/l, and more preferably 0.5–10 g/l, from the viewpoint of ensuring an acceptable etching speed and the solubility of the component (c) compounds.

Amidosulfuric acid or an aliphatic sulfonic acid may be further added to the etching solution of the present invention as component (e) to suppress decomposition of the persulfate. Methyl sulfonic acid, amino sulfonic acid, aminomethyl sulfonic acid, and the like can be given as examples of the aliphatic sulfonic acid. In view of the solubility of the component (e) in water, the concentration of component (e) in the etching solution is preferably 1–100 g/l, and more preferably 1–50 g/l.

Beside the above components, other various additives may be incorporated in the etching solution of the present invention. Such additives include, for example, fluorine-type or nonionic-type surfactants for reducing the surface tension of the solution, inorganic acid such as sulfuric acid and phosphoric acid for stabilizing the etching speed, and the like.

The etching solution of the present invention can be prepared by adding the above-mentioned components, at proportions described above, to water and blending the mixture. There are no specific limitations to the method of addition. The components may be added either all at one time or separately in any arbitrary order. Ion-exchanged water is preferably used as the water.

There are no specific limitations to the method of using the surface etching solution of the present invention. Examples include a method of spraying the solution to the surfaces of copper or copper alloy to be treated, a method of immersing the copper or copper alloy in the solution using an immersion conveyer, and the like.

The etching solution of the present invention can be widely used for chemical cleaning or the like of copper or copper alloys. For example, in the manufacture of multi-layered printed-wiring boards, it can be used for rust-removal and roughening prior to the oxide treatment of the copper surface, for roughening to improve the adhesiveness of etching resists and solder resists, and for rust-removal and roughening to improve the solderability. Recently, fluxes with a weak activity for which no post-washing with flon is necessary are widely used for soldering. Because the soldering using such fluxes is greatly affected by the surface conditions, the use of the etching solution of the present invention, which can perform rust-removal, roughening, and rust-prevention at one time, is particularly effective as the pretreatment of such soldering. The etching solution of the present invention, of course, can be used for roughening and rust-prevention of a variety of materials made from copper or copper alloy.

Other features of the invention will become apparent in the course of the following description of the exemplary embodiments which are given for illustration of the invention and are not intended to be limiting thereof.

EXAMPLES

Examples 1–8, Comparative Examples 1–5

Etching solutions were prepared by dissolving the components listed in Table 1 in water. Double-sided, copper-clad laminates for printed-wiring boards (FR-4) were immersed in a water bath containing the etching solution, stirred at 25° C., for 1 minute to examine the etching speed. After the etching, the laminates were left in an atmosphere at 40° C. and 95% RH for 24 hours to macroscopically examine the formation of rust. The results are shown in Table 1, wherein symbols in the column for rust formation have the following meanings.

AAA: No rust was formed.

BBB: Rust was slightly formed.

CCC: Rust was significant.

Examples 9–12, Comparative Example 6

Etching solutions were prepared by dissolving the components listed in Table 2 in water. To examine stability of the etching solutions, 10 g of copper was dissolved in the solutions and the etching speeds were measured in the same manner as in Example 1, immediately after copper was dissolved and after storing the solution for 24 hours. The results are shown in Table 2.

The etching solution of the present invention is made from an inexpensive persulfate as a major component, and yet exhibits a high etching speed and an effect of preventing rust on the etched surface.

TABLE 1

| | Component (g/l) | | Etching speed (μm/min) | Rust formation |
|---|---|---|---|---|
| Example 1 | Sodium persulfate | 165.0 | 1.5 | AAA-BBB |
| | Sulfuric acid | 30.0 | | |
| | Imidazole | 2.0 | | |
| | Ion-exchanged water | Balance | | |
| Example 2 | Sodium persulfate | 165.0 | 2.3 | AAA |
| | Sulfuric acid | 30.0 | | |
| | 2-Methylimidazole | 2.0 | | |
| | Ion-exchanged water | Balance | | |
| Example 3 | Sodium persulfate | 165.0 | 2.4 | AAA |
| | Sulfuric acid | 30.0 | | |
| | 4-Methylimidazole | 2.0 | | |
| | Ion-exchanged water | Balance | | |
| Example 4 | Sodium persulfate | 165.0 | 2.0 | AAA |
| | Sulfuric acid | 30.0 | | |
| | 2-Aminopyridine | 2.0 | | |
| | Ion-exchanged water | Balance | | |
| Example 5 | Sodium persulfate | 165.0 | 2.0 | AAA |
| | Sulfuric acid | 30.0 | | |
| | 4-Aminopyridine | 2.0 | | |
| | Ion-exchanged water | Balance | | |
| Example 6 | Sodium persulfate | 165.0 | 4.0 | AAA-BBB |
| | Sulfuric acid | 30.0 | | |
| | 2,4-Diamino-6-methyl-triazine | 2.0 | | |
| | Ion-exchanged water | Balance | | |
| Example 7 | Ammonium persulfate | 200.0 | 0.9 | AAA |
| | Sulfuric acid | 30.0 | | |
| | 4-Methylimidazole | 2.0 | | |
| | Ion-exchanged water | Balance | | |
| Example 8 | Ammonium persulfate | 165.0 | 1.1 | AAA |
| | Sulfuric acid | 3.0 | | |
| | 2-Methylimidazole | 2.0 | | |
| | Amidosulfuric acid | 10.0 | | |
| | Ion-exchanged water | Balance | | |
| Comparative Example 1 | Sodium persulfate | 165.0 | 0.7 | CCC |
| | Sulfuric acid | 30.0 | | |
| | Ion-exchanged water | Balance | | |
| Comparative Example 2 | Sodium persulfate | 165.0 | 0.2 | AAA |
| | Sulfuric acid | 30.0 | | |
| | Benzotriazole | 2.0 | | |
| | Ion-exchanged water | Balance | | |
| Comparative Example 3 | Sodium persulfate | 165.0 | 2.2 | CCC |
| | Sulfuric acid | 30.0 | | |
| | 1,2-4-Tetrazole | 2.0 | | |
| | Ion-exchanged water | Balance | | |
| Comparative Example 4 | Sodium persulfate | 165.0 | 0.3 | AAA |
| | Sulfuric acid | 30.0 | | |
| | Pyridine | 2.0 | | |
| | Ion-exchanged water | Balance | | |
| Comparative Example 4 | Sodium persulfate | 200.0 | 0.3 | CCC |
| | Sulfuric acid | 30.0 | | |
| | Ion-exchanged water | Balance | | |

TABLE 2

| | Component (g/l) | | Etching speed (μm/min) | | Decrease (%) |
|---|---|---|---|---|---|
| | | | After preparation | After 24 hours | |
| Example 9 | Sodium persulfate | 165.0 | 2.5 | 2.2 | 12 |
| | Sulfuric acid | 30.0 | | | |

TABLE 2-continued

|  | Component (g/l) |  | Etching speed (μm/min) After preparation | Etching speed (μm/min) After 24 hours | Decrease (%) |
|---|---|---|---|---|---|
|  | 4-Methylimidazole | 2.0 |  |  |  |
|  | Methylsulfonic acid | 10.0 |  |  |  |
|  | Ion-exchanged water | Balance |  |  |  |
| Example 10 | Sodium persulfate | 165.0 | 2.6 | 2.4 | 8 |
|  | Sulfuric acid | 30.0 |  |  |  |
|  | 4-Methylimidazole | 2.0 |  |  |  |
|  | Amidosulfuric acid | 10.0 |  |  |  |
|  | Ion-exchanged water | Balance |  |  |  |
| Example 11 | Sodium persulfate | 165.0 | 2.5 | 2.1 | 16 |
|  | Sulfuric acid | 30.0 |  |  |  |
|  | 4-Methylimidazole | 2.5 |  |  |  |
|  | Taurine* | 10.0 |  |  |  |
|  | Ion-exchanged water | Balance |  |  |  |
| Example 12 | Sodium persulfate | 165.0 | 1.0 | 1.0 | 0 |
|  | Sulfuric acid | 30.0 |  |  |  |
|  | 4-Methylimidazole | 2.0 |  |  |  |
|  | Amidosulfuric acid | 10.0 |  |  |  |
|  | Ion-exchanged water | Balance |  |  |  |
| Comparative Example 6 | Sodium persulfate | 165.0 | 2.2 | 1.4 | 36 |
|  | Sulfuric acid | 30.0 |  |  |  |
|  | 1,2,4-Tetrazole | 2.0 |  |  |  |
|  | Ion-exchanged water | Balance |  |  |  |

*Aminoethanesulfonic acid

What is claimed is:

1. An etching solution for copper or copper alloys comprising:
   (a) sulfuric acid,
   (b) a persulfate,
   (c) at least one compound selected from the group consisting of imidazole, imidazole derivatives, pyridine derivatives in which the 2-position or 4-position thereof is substituted with an alkyl group, an amino group or a carboxyl group, triazine, and triazine derivatives,
   (d) water, and
   (e) amidosulfuric acid or an aliphatic sulfonic acid.

2. The etching solution according to claim 1, wherein component (c) is imidazole or an imidazole derivative.

3. The etching solution according to claim 2, wherein component (c) is an imidazole derivative and said imidazole derivative is selected from the group consisting of 2-methylimidazole, 2-ethylimidazole, 2-propylimidazole, 2-aminoimidazole, 4-methylimidazole, 4-ethylimidazole and 4-propylimidazole.

4. The etching solution according to claim 1, wherein component (c) is triazine or a triazine derivative.

5. The etching solution according to claim 4, wherein component (c) is a triazine derivative and said triazine derivative is selected from the group consisting of 2,4-diamino-6-methyltriazine and 2,4-diamino-6-ethyltriazine.

6. The etching solution according to claim 1, wherein component (c) is a pyridine derivative selected from the group consisting of 2-methylpyridine, 2-aminopyridine, 2-aminomethylpyridine, 2-carboxypyridine, 4-methylpyridine, 4-aminopyridine and 4-aminomethylpyridine.

7. The etching solution according to claim 1, wherein component (e) is an aliphatic sulfonic acid and said aliphatic sulfonic acid is selected from the group consisting of methylsulfonic acid, aminosulfonic acid and aminomethylsulfonic acid.

8. The etching solution according to claim 1, wherein component (c) is present in an amount of 0.1–10 g/l of etching solution.

9. The etching solution according to claim 8, wherein component (c) is present in an amount of 0.5–10 g/l of etching solution.

10. The etching solution according to claim 1, wherein component (e) is present in an amount of 1–100 g/l of etching solution.

11. The etching solution according to claim 10, wherein component (e) is present in an amount of 1–50 g/l of etching solution.

12. The etching solution according to claim 1, wherein said persulfate is present in an amount of 50–250 g/l of etching solution.

13. The etching solution according to claim 1, further comprising a fluorine-containing surfactant or nonionic surfactant.

* * * * *